(12) United States Patent
Kakumu et al.

(10) Patent No.: US 12,279,411 B2
(45) Date of Patent: Apr. 15, 2025

(54) MEMORY DEVICE USING SEMICONDUCTOR DEVICE

(71) Applicant: Unisantis Electronics Singapore Pte. Ltd., Singapore (SG)

(72) Inventors: Masakazu Kakumu, Tokyo (JP); Koji Sakui, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 447 days.

(21) Appl. No.: 17/960,411

(22) Filed: Oct. 5, 2022

(65) Prior Publication Data

US 2023/0108227 A1    Apr. 6, 2023

(30) Foreign Application Priority Data

Oct. 6, 2021 (WO) .................. PCT/JP2021/037009

(51) Int. Cl.
  *H10B 12/00*   (2023.01)
  *G11C 11/404*  (2006.01)
  *G11C 11/4096* (2006.01)

(52) U.S. Cl.
  CPC ............ *H10B 12/20* (2023.02); *G11C 11/404* (2013.01); *G11C 11/4096* (2013.01)

(58) Field of Classification Search
  CPC ...... H10B 12/20; H10B 12/33; G11C 11/404; G11C 11/4096; H10D 1/665

(Continued)

(56) References Cited

U.S. PATENT DOCUMENTS

2003/0111681 A1   7/2003   Kawanaka
2006/0049444 A1   3/2006   Shino
(Continued)

FOREIGN PATENT DOCUMENTS

JP    2003-188279     7/2003
JP    2006-080280 A   3/2006
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Transistor (SGT) for Ultra-High Density LSI's", IEEE Transaction on Electron Devices, vol. 38, No. 3, pp. 573-578 (1991).

(Continued)

*Primary Examiner* — Huan Hoang
(74) *Attorney, Agent, or Firm* — Crowell & Moring LLP

(57) ABSTRACT

First and second impurity layers are formed on a first semiconductor layer on a substrate. A third gate insulating layer covers side walls of the impurity layers and the first semiconductor layer. First and second gate conductor layers and a second insulating layer are formed in a groove, and $n^+$-layers connected to source and bit lines are formed at ends of a second semiconductor layer formed on the second impurity layer and covered with a second gate insulating layer, on which a third gate conductor layer connected to a word line is formed. An operation of maintaining holes generated in a channel region of the second semiconductor layer by impact ionization or a GIDL current near the gate insulating layer and an operation of discharging the holes from the channel region are performed by controlling voltages applied to the source, bit, and word lines and first and second plate lines.

18 Claims, 14 Drawing Sheets

(58) Field of Classification Search
USPC .......................................................... 365/184
See application file for complete search history.

(56) References Cited

U.S. PATENT DOCUMENTS

| | | | |
|---|---|---|---|
| 2006/0157738 A1 | 7/2006 | Kawanaka | |
| 2008/0137394 A1 | 6/2008 | Shimano et al. | |
| 2008/0212366 A1 | 9/2008 | Ohsawa | |
| 2010/0214838 A1* | 8/2010 | Hishida | H10B 43/20 365/185.11 |

FOREIGN PATENT DOCUMENTS

| | | |
|---|---|---|
| JP | 2008-147514 A | 6/2006 |
| JP | 2008-218556 A | 9/2008 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December, pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) pp. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron., vol. E90-C, No. 4 pp. 765-771 (2007).

Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020).

International Search Report (PCT/ISA/210) (Japanese) from PCT/JP2021/037009 dated Nov. 22, 2021, 3 pgs.

English translation of International Search Report (PCT/ISA/210) from PCT/JP2021/037009 dated Nov. 22, 2021, 2 pgs.

International Written Opinion (PCT/ISA/237) (Japanese) from PCT/JP2021/037009 dated Nov. 22, 2021, 4 pgs.

* cited by examiner

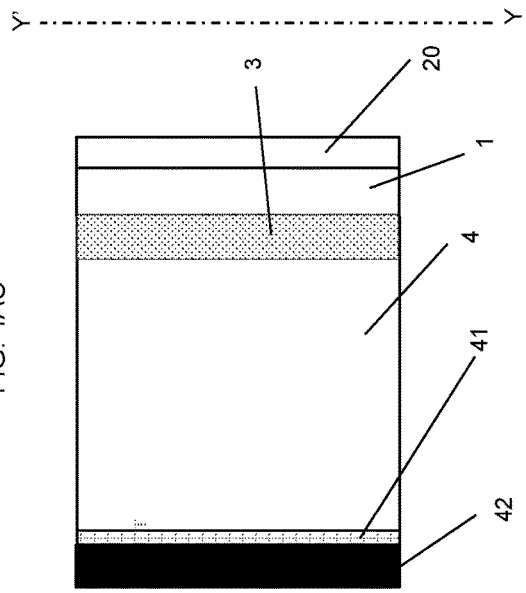
FIG. 4AC
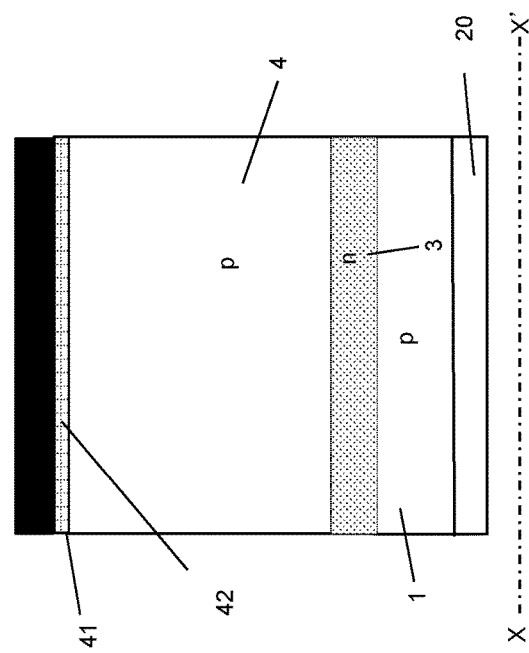
FIG. 4AA
FIG. 4AB

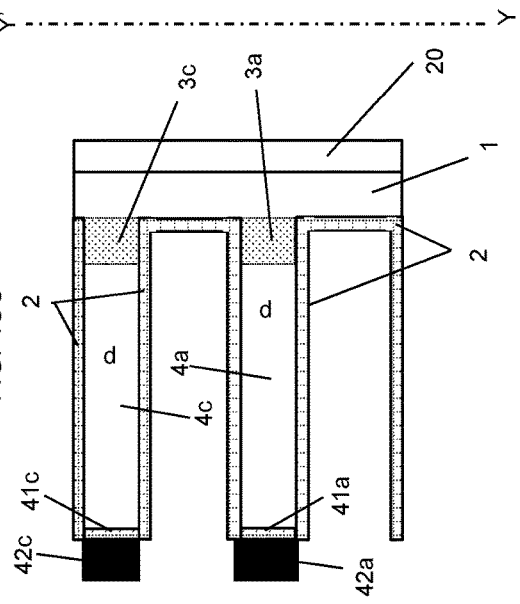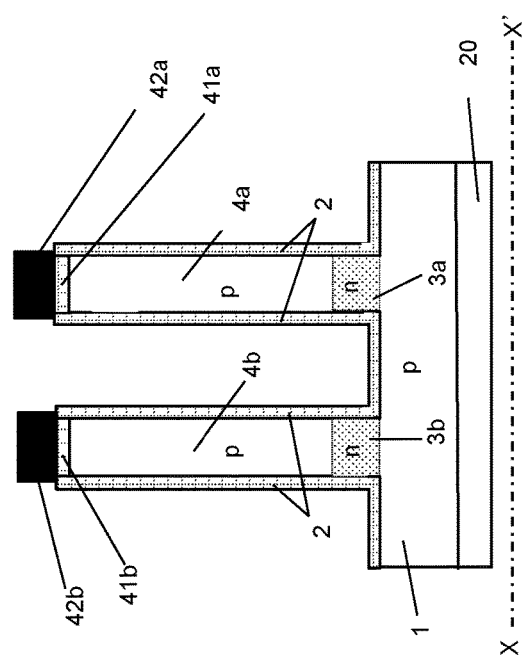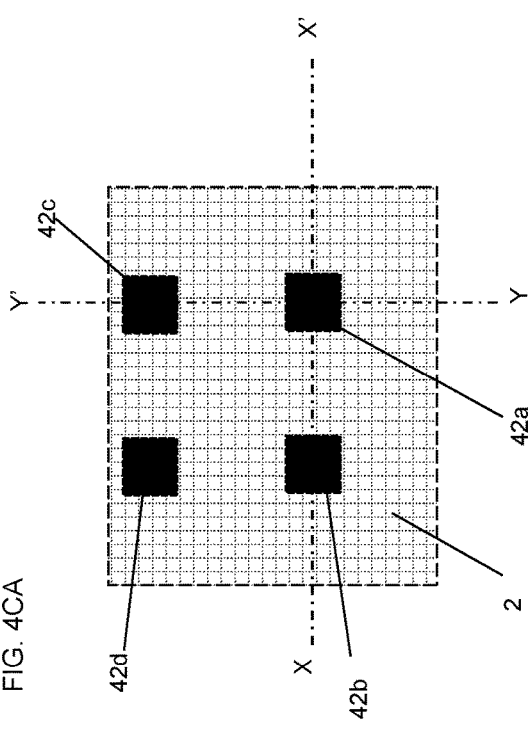

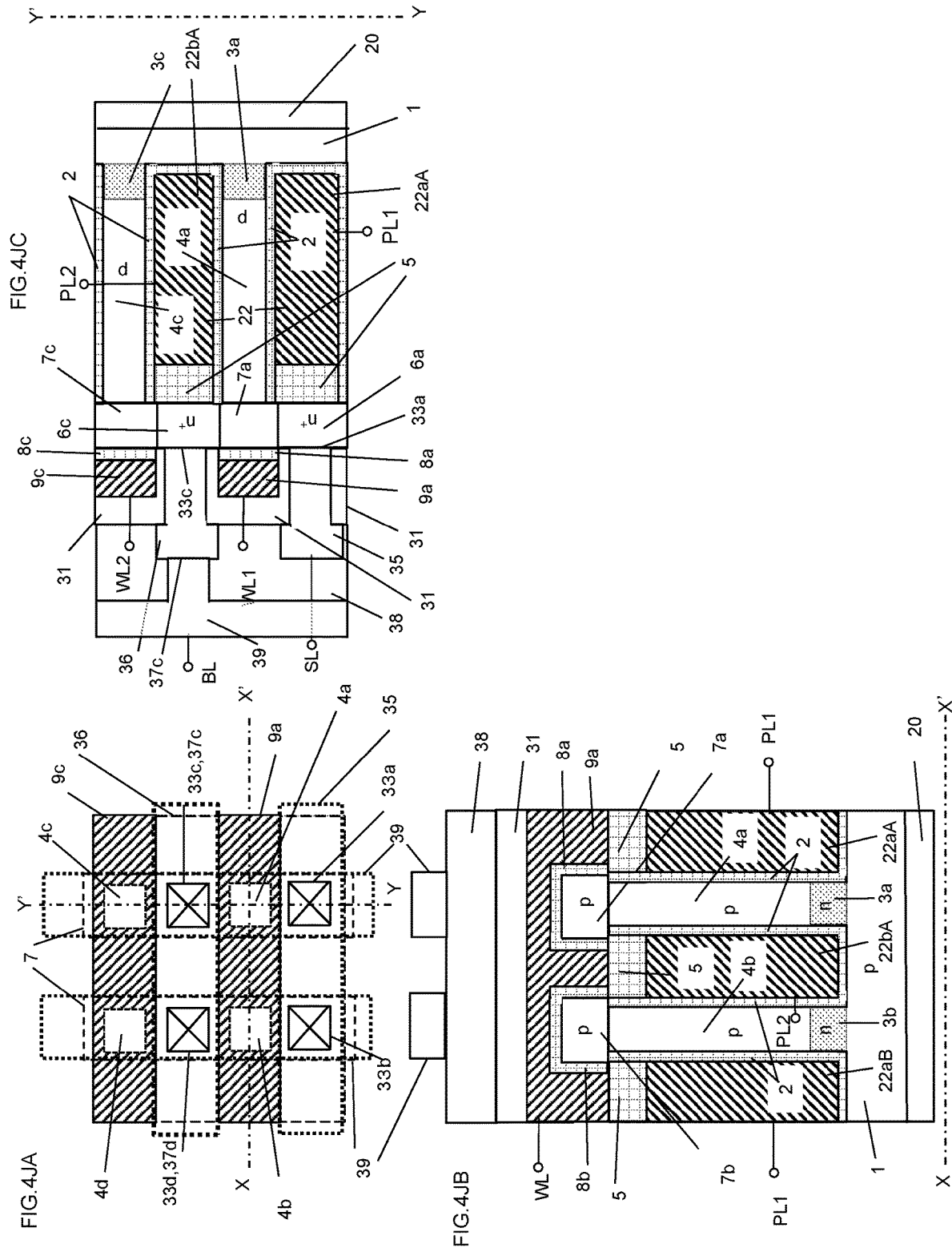

MEMORY DEVICE USING SEMICONDUCTOR DEVICE

RELATED APPLICATIONS

This application claims priority to PCT/JP2021/037009, filed on Oct. 6 2021, the entire content of which is incorporated herein by reference.

BACKGROUND OF THE INVENTION

1. Field of the Invention

The present invention relates to a memory device using a semiconductor device.

2. Description of the Related Art

In development of the large-scale integration (LSI) technology, there have been demands for higher integration, higher performance, lower power consumption, and enhanced functionality of memory devices.

In a normal planar MOS transistor, a channel extends in the horizontal direction along the top surface of a semiconductor substrate. In contrast, a channel of a surrounding gate transistor (SGT) extends in a direction perpendicular to the top surface of a semiconductor substrate (see, for example, Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)). Thus, SGTs can achieve a higher density of semiconductor devices than planar MOS transistors. By using the SGT as a select transistor, high integration can be achieved for memory devices such as a dynamic random-access memory (DRAM) with capacitors (see, for example, H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)), a phase-change memory (PCM) with resistance change elements (see, for example, H. S. Philip Wong, S. Raoux, S. Kim, Jiale Liang, J. R. Reifenberg, B. Rajendran, M. Asheghi, and K. E. Goodson: "Phase Change Memory," Proceeding of IEEE, Vol. 98, No. 12, December, pp. b012b27 (2010)), a resistive random-access memory (RRAM) (see, for example, T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007)), and a magneto-resistive random-access memory (MRAM) that changes a magnetic spin direction by using a current so as to change resistance (see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)). There are also a DRAM memory cell formed of a single MOS transistor that does not include a capacitor (see, for example, M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)), a DRAM memory cell with a groove into which carriers accumulate and two gate electrodes (see, for example, Md. Hasan Raza Ansari, Nupur Navlakha, Jae Yoon Lee, Seongjae Cho, "Double-Gate Junctionless 1T DRAM With Physical Barriers for Retention Improvement", IEEE Trans, on Electron Devices vol. 67, pp. 1471-1479 (2020)), and so forth. However, a DRAM without a capacitor has a problem in that it is greatly affected by coupling of a floating body with a gate electrode from a word line, so that a sufficient voltage margin cannot be obtained. In addition, as a substrate becomes fully depleted, undesirable effects become notable. The present application relates to a memory device that uses a semiconductor device, that does not include either a resistance change element or a capacitor, and that can be formed only of a MOS transistor.

SUMMARY OF THE INVENTION

In a single transistor DRAM (a gain cell) that is one of memory devices and that does not include a capacitor, the capacitive coupling between a word line and a body with an element in a floating state is large, and when the potential of the word line is changed at the time of reading or writing data, there has been a problem in that the change is transmitted as noise directly to a body of a semiconductor substrate. This causes problems including incorrect reading and unintentional rewriting of stored data, and thus, it has been difficult to put such a single transistor DRAM (a gain cell) without a capacitor to practical use. It is necessary to solve the above problems and achieve high density of DRAM memory cells.

To solve the above-described problems, a memory device using a semiconductor device according to the present invention includes a substrate, a first semiconductor layer that is disposed on the substrate, a first impurity layer that is disposed on a portion of a surface of the first semiconductor layer and at least a portion of which has a columnar shape, a second impurity layer that is in contact with the portion of the first impurity layer having a columnar shape and that extends in a vertical direction, a first insulating layer that covers a portion of the first semiconductor layer and a portion of the first impurity layer, a first gate insulating layer that is in contact with the first insulating layer and that surrounds the first impurity layer and the second impurity layer, a first gate conductor layer and a second gate conductor layer that are in contact with the first insulating layer and the first gate insulating layer, a second insulating layer that is formed in such a manner as to be in contact with the first gate conductor layer, the second gate conductor layer, the first insulating layer, and the first gate insulating layer, a second semiconductor layer that is in contact with the second impurity layer, a second gate insulating layer that partially or entirely surrounds an upper portion of the second semiconductor layer, a third gate conductor layer that partially or entirely covers an upper portion of the second gate insulating layer, a third impurity layer and a fourth impurity layer each of which is in contact with one of two side surfaces of the second semiconductor layer located outside an end of the third gate conductor layer in a horizontal direction in which the second semiconductor layer extends, a first wiring conductor layer that is connected to the third impurity layer, a second wiring conductor layer that is connected to the fourth impurity layer, a third wiring conductor layer that is connected to the third gate conductor layer, a fourth wiring conductor layer that is connected to the first gate conductor layer, and a fifth wiring conductor layer that is connected to the second gate conductor layer. A memory write operation is performed by performing an operation of generating a group of electrons and a group of holes in the second semiconductor layer and the second impurity layer by using impact ionization that is caused by a current supplied between the third impurity layer and the fourth impurity layer or by using a gate-induced drain leakage current, an operation of discharging minority carriers in the second semiconductor layer and the second impurity layer, the minority carriers being the generated group of electrons or the generated group of holes, and an operation of causing a subset or all of majority carriers in the second semiconductor layer and the second impurity layer, the majority carriers being the group of electrons or the group of holes, to remain in the second semiconductor layer and the second impurity layer by controlling voltages that are applied to the first wiring conductor layer, the second wiring conductor layer, the third wiring conductor layer, the fourth wiring conductor layer, and the fifth wiring conductor layer. A memory erase operation is performed by extracting the majority carriers remaining in the second semiconductor layer, the majority carriers being the group of electrons or the group of holes, from at least one location of the first impurity layer, the third impurity layer, and the fourth impurity layer by controlling voltages that are applied to the first wiring conductor layer, the second wiring conductor layer, the third wiring conductor layer, the fourth wiring conductor layer, and the fifth wiring conductor layer. (First aspect of the present invention)

In the first aspect of the present invention, the first wiring conductor layer that is connected to the third impurity layer is a source line. The second wiring conductor layer that is connected to the fourth impurity layer is a bit line. The third wiring conductor layer that is connected to the third gate conductor layer is a word line. The fourth wiring conductor layer that is connected to the first gate conductor layer is a first plate line. The fifth wiring conductor layer that is connected to the second gate conductor layer is a second plate line. Write and erase memory operations are performed by applying voltages to the source line, the bit line, the first plate line, the second plate line, and the word line. (Second aspect of the present invention)

In the second aspect of the present invention, a concentration of carriers at an interface between the first gate insulating layer and the second impurity layer is changed by synchronizing the voltages applied to the first plate line and the second plate line. (Third aspect of the present invention)

In the second aspect of the present invention, a concentration of carriers at an interface between the first gate insulating layer and the second impurity layer is changed by applying independent voltages to the first plate line and the second plate line. (Fourth aspect of the present invention)

In the second aspect of the present invention, by applying voltages to the first plate line and the second plate line, majority carriers the same as majority carriers in the first impurity layer are excited, and an electrical contact area between the first impurity layer and the second impurity layer is changed. (Fifth aspect of the present invention)

In the first aspect of the present invention, majority carriers in the first impurity layer are different from majority carriers in the first semiconductor layer. (Sixth aspect of the present invention)

In the first aspect of the present invention, the majority carriers in the second impurity layer are the same as majority carriers in the first semiconductor layer. (Seventh aspect of the present invention)

In the first aspect of the present invention, majority carriers in the third impurity layer and majority carriers in the fourth impurity layer are the same as majority carriers in the first impurity layer. (Eighth aspect of the present invention)

In the first aspect of the present invention, an impurity concentration of the first impurity layer is lower than an impurity concentration of the third impurity layer and lower than an impurity concentration of the fourth impurity layer. (Ninth aspect of the present invention)

In the first aspect of the present invention, contact surfaces of the first impurity layer and the second impurity layer are located at positions shallower than a bottom portion of the first gate conductor layer and shallower than a bottom portion of the second gate conductor layer. (Tenth aspect of the present invention)

In the first aspect of the present invention, the first semiconductor layer, the first impurity layer, the second impurity layer, the second semiconductor layer, and the third impurity layer form a thyristor structure. (Eleventh aspect of the present invention)

In the first aspect of the present invention, the first semiconductor layer, the first impurity layer, the second impurity layer, the second semiconductor layer, and the fourth impurity layer form a thyristor structure. (Twelfth aspect of the present invention)

In the second aspect of the present invention, a source-line contact hole for connecting the source line to the third impurity layer and the first wiring conductor layer are shared by adjacent cells. (Thirteenth aspect of the present invention)

In the second aspect of the present invention, a bit-line contact hole for connecting the bit line to the fourth impurity layer and the second wiring conductor layer are shared by adjacent cells. (Fourteenth aspect of the present invention)

In the first or second aspect of the present invention, a bottom portion of the first impurity layer is located at a position deeper than a bottom portion of the first insulating layer, and the first impurity layer is shared by a plurality of cells. (Fifteenth aspect of the present invention)

In the eleventh aspect of the present invention, the memory device using a semiconductor device further includes a sixth wiring conductor layer that is connected to the first impurity layer, and the sixth wiring conductor layer is a control line and is capable of applying a desired voltage. (Sixteenth aspect of the present invention)

In the first aspect of the present invention, the first impurity layer is connected between adjacent cells by a semiconductor or a metal layer. (Seventeenth aspect of the present invention)

BRIEF DESCRIPTION OF THE DRAWINGS

FIGS. 4AA, 4AB, and 4AC are diagrams illustrating a method of manufacturing a memory device according to a second embodiment.

FIGS. 4CA, 4CB, and 4CC are diagrams illustrating the method of manufacturing the memory device according to the second embodiment.

FIGS. 4JA, 4JB, and 4JC are diagrams illustrating the method of manufacturing the memory device according to the second embodiment.

DETAILED DESCRIPTION OF THE PREFERRED EMBODIMENTS

A structure of a memory device using a semiconductor device according to the present invention, a driving method of the memory device, and the behavior of accumulated carriers in the memory device will be described below with reference to the drawings.

First Embodiment

A structure and an operation mechanism of a memory cell using a semiconductor device according to the first embodiment of the present invention will be described with reference to FIG. 1 to FIG. 3C. A cell structure of a memory using a semiconductor device according to the present embodiment will be described with reference to FIG. 1. A write mechanism of the memory using a semiconductor device and the behavior of carriers will be described with reference to FIGS. 2A, 2B, 2C, and 2D, and a data erase mechanism of the memory will be described with reference to FIGS. 3A, 3B, and 3C.

Figure 1:
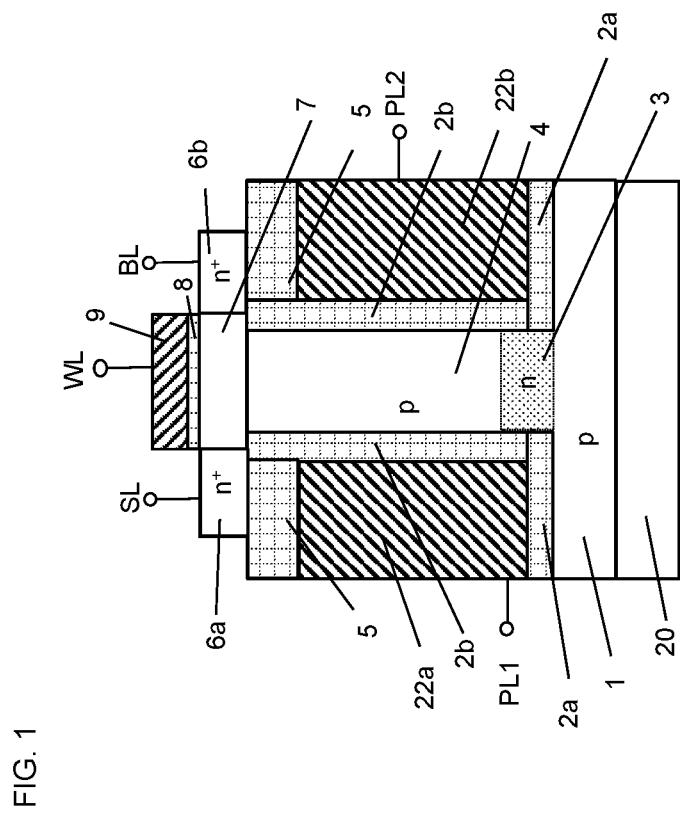
FIG. 1 illustrates a sectional structure of a memory device using a semiconductor device according to a first embodiment.

FIG. 1 illustrates a sectional structure of the memory using a semiconductor device according to the first embodiment of the present invention. A silicon p-layer 1 (which is an example of a "first semiconductor layer" in the claims) that contains an acceptor impurity and whose conductivity type is the p-type is disposed on a substrate 20 (which is an example of a "substrate" in the claims). An n-layer 3 (which is an example of a "first impurity layer" in the claims) that contains a donor impurity and that has a columnar shape vertically extends from a surface of the p-layer 1, and a p-layer 4 (which is an example of a "second impurity layer" in the claims) that contains an acceptor impurity and that has a columnar shape is disposed on the n-layer 3. An insulating layer 2a (which is an example of a "first insulating layer" in the claims) partially covers the p-layer 1 and the n-layer 3, and a gate insulating layer 2b (which is an example of a "first gate insulating layer" in the claims) partially covers the p-layer 4. A gate conductor layer 22a (which is an example of a "first gate conductor layer" in the claims) and a gate conductor layer 22b (which is an example of a "second gate conductor layer" in the claims) are in contact with the insulating layer 2a and the gate insulating layer 2b. An insulating layer 5 (which is an example of a "second insulating layer" in the claims) is in contact with the insulating layer 2a, the gate insulating layer 2b and the gate conductor layer 22a, or the gate conductor layer 22b. A p-layer 7 (which is an example of a "second semiconductor layer" in the claims) that contains an acceptor impurity is in contact with the p-layer 4.

An n$^+$-layer 6a (which is an example of a "third impurity layer" in the claims) that contains a high concentration of donor impurity is disposed on one side of the p-layer 7 (a semiconductor region containing a high concentration of donor impurity will hereinafter be referred to as "n$^+$-layer"). An n$^+$-layer 6b (which is an example of a "fourth impurity layer" in the claims) is disposed on another side of the p-layer 7 that is the side opposite to the side on which the n$^+$-layer 6a is disposed.

A gate insulating layer 8 (which is an example of a "second gate insulating layer" in the claims) is disposed on a surface of the p-layer 7. The gate insulating layer 8 is in contact with or is positioned close to each of the n$^+$-layer 6a and the n$^+$-layer 6b. A gate conductor layer 9 (which is an example of a "third gate conductor layer" in the claims) is disposed on a side of the gate insulating layer 8, the side being opposite to the side on which the p-layer 7 is disposed, in such a manner as to be in contact with the gate insulating layer 8.

As a result, the memory device using a semiconductor device that includes the substrate 20, the p-layer 1, the insulating layer 2a, the gate insulating layer 2b, the gate conductor layers 22a and 22b, the insulating layer 5, the n-layer 3, the p-layer 4, the n$^+$-layer 6a, the n$^+$-layer 6b, the p-layer 7, the gate insulating layer 8, and the gate conductor layer 9 is formed. The n$^+$-layer 6a is connected to a source line SL (which is an example of a "source line" in the claims) that is a first wiring conductor layer. The n$^+$-layer 6b is connected to a bit line BL (which is an example of a "bit line" in the claims) that is a second wiring conductor layer. The gate conductor layer 9 is connected to a word line WL (which is an example of a "word line" in the claims) that is a third wiring conductor layer. The gate conductor layer 22a is connected to a plate line PL1 (which is an example of a "first plate line" in the claims) that is a fourth wiring conductor layer. The gate conductor layer 22b is connected to a plate line PL2 (which is an example of a "second plate line" in the claims) that is a fifth wiring conductor layer. The memory is operated by controlling the potentials of the source line SL, the bit line BL, the plate line PL1, the plate line PL2, and the word line WL. This memory device will be referred to as a dynamic flash memory.

The memory device includes a single dynamic flash memory cell mentioned above and disposed on the substrate 20, or the memory device includes a plurality of dynamic flash memory cells mentioned above and two-dimensionally arranged on the substrate 20.

In FIG. 1, the p-layer 1 is a p-type semiconductor. The impurity concentration of the p-layer 1 may have a profile. The impurity concentration of each of the n-layer 3, the p-layer 4, and the p-layer 7 may have a profile. The impurity concentration and the profile of each of the p-layer 4 and the p-layer 7 may be independently set.

In the case where the n$^+$-layer 6a and the n$^+$-layer 6b are each formed of a p$^+$ layer, if the p-layer 1, the p-layer 4, and the p-layer 7 are each an n-type semiconductor, and the n-layer 3 is a p-type semiconductor, the dynamic flash memory operates by using signal carriers as electrons.

In addition, in FIG. 1, although the first semiconductor layer 1 is a p-type semiconductor, the dynamic flash memory operates even if the memory cell of the present invention is disposed on the substrate 20 while the substrate 20 is formed by using an n-type semiconductor substrate having a p-well formed therein and serves as the first semiconductor layer 1.

Although the insulating layer 2a and the gate insulating layer 2b are separately illustrated in FIG. 1, they may be integrally formed. In the following description, the insulating layer 2a and the gate insulating layer 2b will also be collectively referred to as a "gate insulating layer 2", and they may be formed by the same process.

In FIG. 1, although the second semiconductor layer 7 is a p-type semiconductor, any one of a p-type semiconductor, an n-type semiconductor, and an i-type semiconductor can be used for the second semiconductor layer 7 depending on the majority carrier concentration of the p-layer 4, the thickness of the second semiconductor layer 7, the material and the thickness of the gate insulating layer 8, and the material of the gate conductor layer 9.

Although FIG. 1 illustrates a bottom portion of the p-layer 7 and the top surface of the insulating layer 5 in such a manner that their positions are at the same level, the position of the bottom of the p-layer 7 and the position of the top surface of the insulating layer 5 may be at different levels as long as the p-layer 4 and the p-layer 7 are in contact with each other and a portion where the n-layer 3 and the p-layer 4 are in contact with each other is shallower than a bottom portion of each of the gate conductor layers 22a and 22b.

The substrate 20 can be made by using any material such as an insulator, a semiconductor, or a conductor as long as it can support the p-layer 1.

The gate conductor layer 22a and the gate conductor layer 22b may each be a heavily doped semiconductor layer or a conductor layer as long as they can change the potential of a portion of the memory cell independently of each other or in synchronization via the insulating layer 2a or the gate insulating layer 2b.

The source line SL, which is the first wiring conductor layer, the bit line BL, which is the second wiring conductor layer, the word line WL, which is the third wiring conductor layer, the plate line PL1, which is the fourth wiring conductor layer, and the plate line PL2, which is the fifth wiring conductor layer, may be multilayered as long as they are not in contact with one another.

Although FIG. 1 illustrates a bottom portion of the n-layer 3 and a bottom portion of the insulating layer 2a in such a manner that their positions are at the same level, their positions are not necessarily at the same level as long as the n-layer 3 is in contact with both the p-layer 1 and the gate insulating layer 2b.

In FIG. 1, although the n-layer 3 of the memory cell is connected to the p-layer 1, a portion of the memory cell may be connected to the n-layer 3 by using a metal layer instead of the p-layer 1.

Although FIG. 1 illustrates a normal MOS transistor structure including the n$^+$-layer 6a, the n$^+$-layer 6b, the gate insulating layer 8, the p-layer 7, and the gate conductor layer 9, the memory can operate also by employing a fin field-effect transistor (FinFET) in which an interface between the p-layer 7 and the gate insulating layer 8 is positioned higher than the positions of the n$^+$-layers 6a and 6b.

Figure 2A:
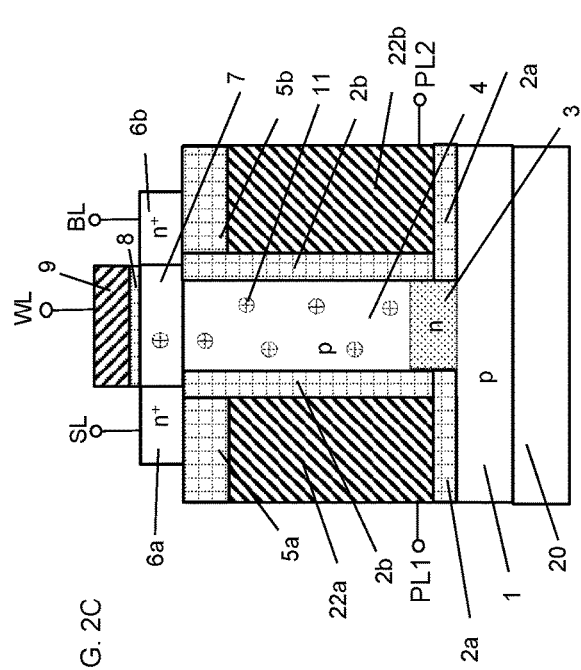
FIGS. 2A, 2B, 2C, and 2D are diagrams illustrating a write operation, accumulation of carriers immediately after the write operation, and a cell current in the memory device using a semiconductor device according to the first embodiment.

The behavior of carriers, accumulation of the carriers, and a cell current when the dynamic flash memory according to the first embodiment of the present invention performs a write operation will be described with reference to FIGS. 2A, 2B, 2C, and 2D. The majority carriers of the n$^+$-layer 6a and the n$^+$-layer 6b are electrons, and for example, p$^+$ poly (poly-Si containing a high concentration of acceptor impurity will hereinafter be referred to as "p$^+$ poly") is used for the gate conductor layer 22a connected to the plate line PL1 and the gate conductor layer 22b connected to the plate line PL2. The case in which, for example, n$^+$ poly (poly-Si containing a high concentration of donor impurity will hereinafter be referred to as "n$^+$ poly") is used for the gate conductor layer 9 connected to the word line WL and in which a p-type semiconductor is used as the second semiconductor layer 7 will be described. As illustrated in FIG. 2A, the MOSFET in the memory cell operates while including, as its components, the n$^+$-layer 6a serving as a source, the n$^+$-layer 6b serving as a drain, the gate insulating layer 8, the gate conductor layer 9 serving as a gate, and the p-layer 7 serving as a substrate. For example, 0 V is applied to the p-layer 1, and for example, 0 V is input to the n$^+$-layer 6a connected to the source line SL. For example, 3 V is input to the n$^+$-layer 6b connected to the bit line BL, and 0 V is input to the gate conductor layer 22a connected to the plate line PL1 and to the gate conductor layer 22b connected to the plate line PL2. For example, 1.5 V is input to the gate conductor layer 9 connected to the word line WL. An inversion layer 12 is formed in a region directly under the gate insulating layer 8, which is positioned below the gate conductor layer 9, and there is a pinch-off point 13. Accordingly, the MOSFET that includes the gate conductor layer 9 operates in a saturation region.

As a result, in the MOSFET including the gate conductor layer 9, an electric field is maximized in a boundary region between the pinch-off point 13 and the n$^+$-layer 6b, and impact ionization occurs in this region. As a result of this impact ionization, electrons accelerated in a direction from the n$^+$-layer 6a connected to the source line SL toward the n$^+$-layer 6b connected to the bit line BL collide with a Si lattice, and electron-hole pairs are generated by the kinetic energy of the electrons. Although some of the generated electrons flow into the gate conductor layer 9, most of them flow into the n$^+$-layer 6b connected to the bit line BL.

Note that, instead of causing the above-mentioned impact ionization to occur, a gate-induced drain leakage (GIDL) current may be caused to flow so as to generate a group of holes (see, for example, E. Yoshida, T, Tanaka, "A Capacitorless 1T-DARM Technology Using Gate-Induced Drain-Leakage (GIDL) Current for Low-Power and High-Speed Embedded Memory", IEEE Trans, on Electron Devices vol. 53, pp. 692-697 (2006)).

Figure 2D:
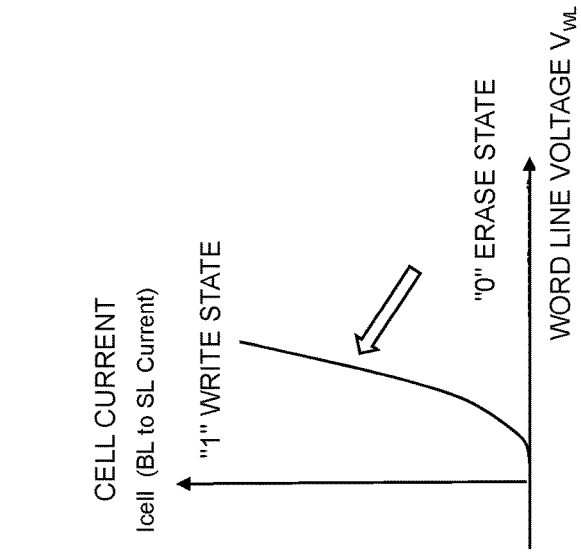
Figure 2B:
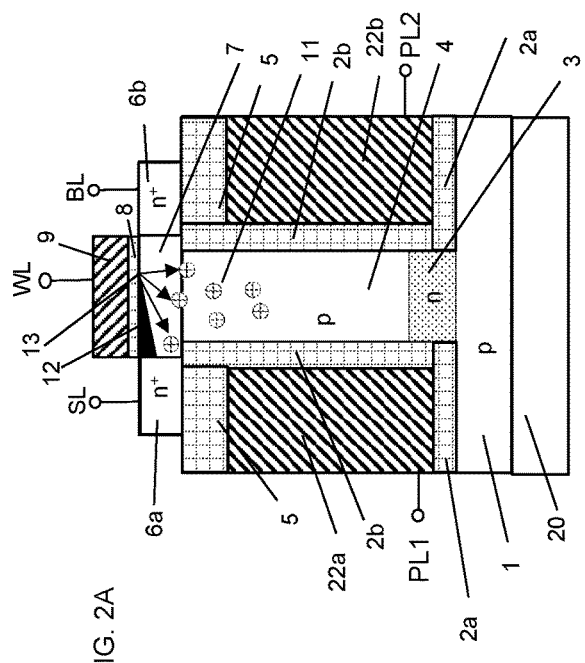

FIG. 2B illustrates a hole group 11 that is present in the p-layer 4 when −1 V is applied to the plate line PL1 and the other biases are 0 V immediately after a write operation has been performed. The generated hole group 11 includes the majority carriers of the p-layer 4 and the p-layer 7, and the concentration gradient thereof and the bias of the gate conductor layer 22a cause the generated hole group 11 to move closer to an interface between the gate conductor layer 22a and the p-layer 4, which is in contact with the gate insulating layer 2b and which is the second impurity layer, and to accumulate near the interface.

Figure 2C:
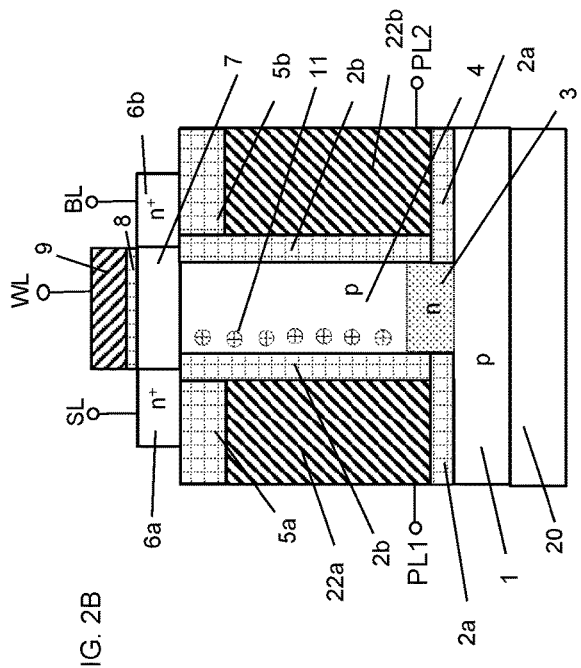

In the case of reading information in the memory cell, when the voltages applied to the plate lines PL1 and PL2 are set to 0 V, as illustrated in FIG. 2C, the holes accumulated in the p-layer 4 and the p-layer 7 are uniformly diffused for a short time, and the p-layer 7, which is the substrate of the MOSFET substantially including the gate conductor layer 9 in a non-equilibrium state, is charged to a positive bias. Holes in a depletion layer move to the source line SL side or toward the n-layer 3 by an electric field and recombine with electrons. As a result, the threshold voltage of the MOSFET including the gate conductor layer 9 is reduced by a positive substrate bias effect due to the holes temporarily accumulated in the p-layer 4 and the p-layer 7. Consequently, as illustrated in FIG. 2D, the threshold voltage of the MOSFET including the gate conductor layer 9, which is connected to the word line WL, is reduced. This write state is assigned to logical stored data "1".

Note that the conditions of the voltages that are applied to the bit line BL, the source line SL, the word line WL, the plate line PL1, and the plate line PL2, which have been mentioned above, are examples for performing a write operation, and other voltage conditions may be used as long as the write operation can be performed.

In FIGS. 2A, 2B, 2C, and 2D, although $n^+$ poly is used as the gate conductor layer 9, a heavily doped semiconductor such as $p^+$ poly, a metal layer such as W, a metal layer having a laminated structure such as W/TiN, or the like may be used.

In FIGS. 2A, 2B, 2C, and 2D, although $p^+$ poly is used as the gate conductor layers 22a and 22b, $n^+$ poly, a metal layer, a metal nitride, a conductor layer that has a metal laminated structure or that is made of, for example, silicide, or the like may also be used. A material used for the gate conductor layer 22a and a material used for the gate conductor layer 22b may be different from each other. These materials can be selected by taking into consideration the relationship with the voltages applied to the plate lines PL1 and PL2 at the time of writing data, the film thickness of the gate insulating layer 2, and the impurity concentration of the p-layer 4.

According to the structure of the present embodiment, the p-layer 7 of the MOSFET including the gate conductor layer 9, which is connected to the word line WL, is electrically connected to the p-layer 4, and thus, the capacity of the p-layer 7 for enabling generated holes to accumulate can be freely changed by adjusting the volume of p-layer 4. In other words, in order to increase the length of time that the p-layer 7 can hold the holes, for example, the depth of the p-layer 4 may be increased. Thus, it is necessary that a bottom portion of the p-layer 4 be positioned deeper than the bottom portion of the p-layer 7. In addition, the area in which the n-layer 3, the $n^+$-layer 6a, and the $n^+$-layer 6b, which are involved in recombination with electrons, are in contact can be reduced to be smaller than a portion in which hole carriers accumulate, which are the volumes of the p-layer 4 and the p-layer 7 in this case. Thus, recombination with electrons can be suppressed, and the length of time that accumulated holes are held can be increased.

According to the structure of the present embodiment, in the case illustrated in FIG. 1, application of a negative voltage to the gate conductor layer 22a enables generated holes to stably accumulate near the interface between the gate insulating layer 2b and the p-layer 4, which is in contact with the gate insulating layer 2b and which is the second impurity layer. In addition, the threshold value of the MOSFET is increased by a negative substrate bias effect, and a leak current of the MOSFET during memory retention can be reduced. Consequently, as a writing effect of this memory device, the retention time of the memory increases, and the voltage margin for "1" write can be further increased.

According to the structure of the present embodiment, application of a voltage to the gate conductor layer 22a and application of a voltage to the gate conductor layer 22b are performed independently of each other. For example, a similar effect can be obtained by applying −1 V to the gate conductor layer 22b and applying 0 V to the gate conductor layer 22a contrary to the case illustrated in FIG. 2B. Alternatively, −1V may be applied to both the gate conductor layers 22a and 22b. The structure of the present embodiment has an advantage in that bias adjustment can be performed so as to obtain the best effect. In addition, the applied voltages can be changed by synchronizing the voltages of the gate conductor layers 22a and 22b.

Figure 3C:
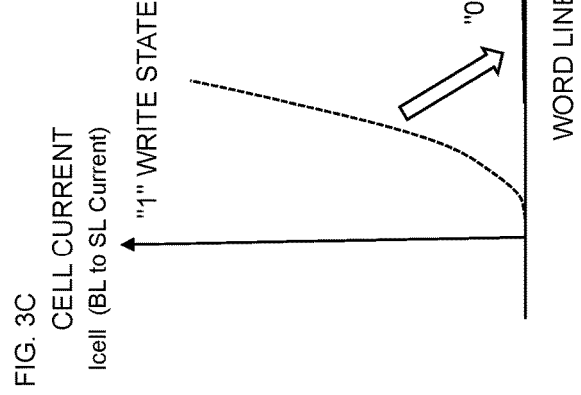
FIGS. 3A, 3B, and 3C are diagrams illustrating accumulation of hole carriers immediately after the write operation, an erase operation, and a cell current in the memory device using a semiconductor device according to the first embodiment.
Figure 3A:
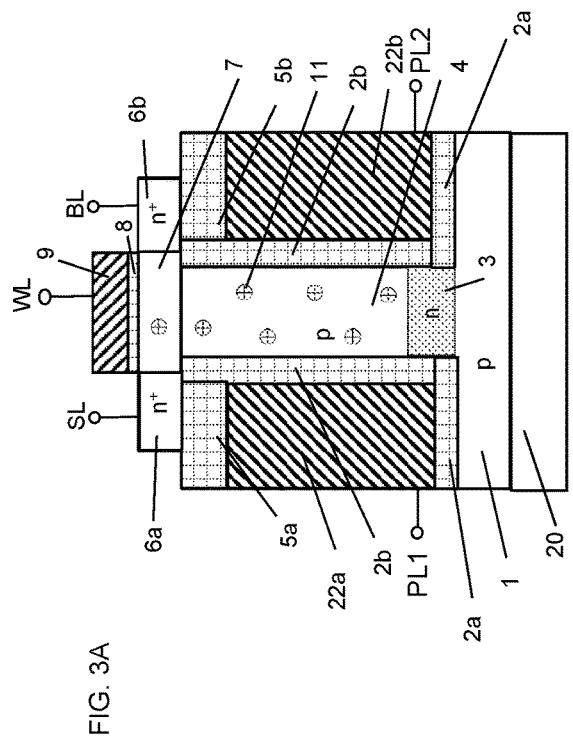
Figure 3B:
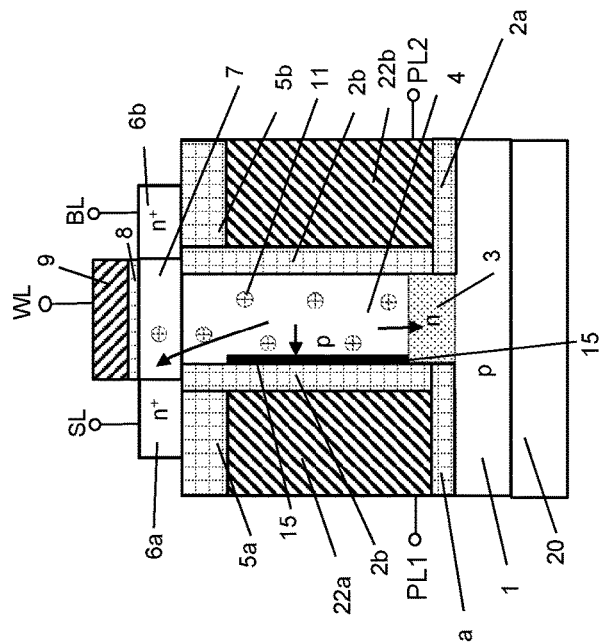

An erase operation mechanism will be described with reference to FIGS. 3A, 3B, and 3C. FIG. 3A illustrates a state immediately after the hole group 11 generated in the previous cycle by impact ionization has been stored in the p-layer 4 and the p-layer 7 and all the biases have become 0 V before an erase operation is performed. As illustrated in FIG. 3B, when the erase operation is performed, the voltage of the source line SL is set to a negative voltage VERA, and the voltage of the gate conductor layer 22a is set to a positive voltage. Here, the VERA is, for example, −3 V, and the voltage of the gate conductor layer 22a is 1 V. Consequently, an inversion layer 15 is formed in the vicinity of the interface between the gate conductor layer 22a and the p-layer 4, which is in contact with the gate insulating layer 2b and which is the second impurity layer. As a result, regardless of the value of the initial potential of the p-layer 7, a PN junction formed between the $n^+$-layer 6a, which is connected to the source line SL and which serves as the source, and the p-layer 7 is forward biased. In addition, as a result, the hole group 11 generated in the previous cycle by impact ionization and stored in the p-layer 4 and the p-layer 7 moves to the $n^+$-layer 6a connected to the source line SL by the diffusion current. Some of the holes flow from the p-layer 4 through the inversion layer 15 formed at the interface between the gate insulating layer 2b and the p-layer 4 or directly flow into the n-layer 3, and the hole concentration in each of the p-layer 4 and the p-layer 7 decreases over time. The threshold voltage of the MOSFET becomes higher than that when "1" is written and returns to the initial state. As a result, as illustrated in FIG. 3C, the MOSFET including the gate conductor layer 9, which is connected to the word line WL, returns to its original threshold. This erase state of the dynamic flash memory is logical stored data "0".

According to the structure of the present embodiment, the p-layer 1, the n-layer 3, the p-layer 4, the p-layer 7, and the $n^+$-layer 6a form a thyristor structure. When −3 V is applied to the source line SL at the time of an erase operation, a large number of electrons are injected from the source line SL, and conversely, the holes are diffused and flow toward the n-layer 3. They recombine with the accumulated holes, and at the same time, they are drifted by an electric field to the n-layer 3, which is the first impurity layer, or the bit line BL, so that a significant reduction in the time taken for the erase operation can be expected. Thus, a stable state of logical information data "0" can be provided in a short time, and the operating speed of the dynamic flash memory element increases.

Alternatively, the p-layer 1, the n-layer 3, the p-layer 4, the p-layer 7, and the $n^+$-layer 6b can form a thyristor structure, and a similar advantageous effect can be expected by applying, for example, −3 V to the bit line BL at the time of an erase operation.

According to the structure of the present invention, by applying a positive voltage to the gate conductor layer 22a, electrons are excited in the vicinity of the interface between the gate insulating layer 2b and the p-layer 4, which is in contact with the gate insulating layer 2b and which is the second impurity layer, and an inversion layer is formed. As a result, the recombination area of electrons and holes can be increased, and the threshold can be reduced by the positive substrate bias effect, which in turn results in an increase in an operating current or a leak current due to the MOSFET, so that a further reduction in the time taken for the erase operation can be achieved.

Note that the conditions of the voltages that are applied to the bit line BL, the source line SL, the word line WL, the plate line PL1, and the plate line PL2, which have been mentioned above, are examples for performing an erase operation, and other voltage conditions may be used as long as the erase operation can be performed.

According to the present embodiment, the p-layer 7 that is one of the components of the MOSFET and that reads and writes information is electrically connected to the p-layer 1, the n-layer 3, and the p-layer 4. In addition, independent voltages can be applied to the gate conductor layer 22a and the gate conductor layer 22b. Thus, both in a write operation and an erase operation, unlike, for example, a SOI structure, a substrate bias will not become unstable in a floating state during the period when the MOSFET is operating, or a semiconductor portion below the gate insulating layer 8 will not become fully depleted. Therefore, the threshold of the MOSFET, the drive current, and the like are less likely to be affected by an operation state.

In addition, by changing the voltages applied to the gate conductor layers 22a and 22b independently of each other, the threshold of the MOSFET can be adjusted to a desired value. For example, the threshold of the MOSFET can be increased by applying a negative voltage to the gate conductor layers 22a and 22b, and conversely, the threshold can be reduced by applying a positive voltage to the gate conductor layers 22a and 22b. Alternatively, a voltage may be applied by synchronizing the gate conductor layers 22a and 22b.

Therefore, regarding the characteristics of the MOSFET, a voltage for a desired memory operation can be widely set by adjusting: the thickness of the gate insulating layer 2; the potential applied to each of the gate conductor layers 22a and 22b; the thickness, the type of an impurity, impurity concentration, and a profile of the second semiconductor layer 7; impurity concentration and a profile of the p-layer 4; the thickness and a material of the gate insulating layer 8; and the work function of the gate conductor layer 9. In addition, since the bottom of the MOSFET does not become fully depleted, and the depletion layer extends in a depth direction of the p-layer 4, the influence of coupling of a floating body with a gate electrode from a word line, which has been a disadvantage of a DRAM without a capacitor, is negligible. In other words, according to the present embodiment, a margin for the operating voltage as a dynamic flash memory can be widely designed.

The present embodiment has the following features.
Feature 1

In the dynamic flash memory according to the first embodiment of the present invention, a substrate region in which a channel of the MOSFET is formed includes the p-layer 4 and the p-layer 7, which are surrounded by the insulating layer 2a, the gate insulating layer 2b, and the n-layer 3. With this structure, majority carriers that are generated at the time of writing logical data "1" can accumulate in the p-layer 7 and the p-layer 4, and the number of the majority carriers can be increased, so that the length of time that information is maintained increases. In addition, when data is erased, by applying a negative voltage to the $n^+$-layer 6a connected to the source line SL, the thyristor structure, which is formed of the $n^+$-layer 6a, the p-layer 7, the p-layer 4, the n-layer 3, and the p-layer 1, facilitates erasing. Furthermore, application of a voltage to the gate conductor layer 22a and application of a voltage to the gate conductor layer 22b are performed independently of each other, so that the memory can perform a more stable operation. Therefore, the operating margin of the memory can be increased, and the power consumption can be reduced. This leads to a high-speed operation of the memory.
Feature 2

In the dynamic flash memory according to the first embodiment of the present invention, the p-layer 7 that is one of the components of the MOSFET is connected to the p-layer 4, the n-layer 3, and the p-layer 1, and by adjusting the voltages applied to the gate conductor layers 22b and 22a independently of each other or in synchronization, the p-layer 7 and the p-layer 4 located below the gate insulating layer 8 do not become fully depleted. Consequently, the threshold of the MOSFET, the drive current, and the like are less likely to be affected by the operation state of the memory. In addition, since the bottom of the MOSFET does not become fully depleted, the influence of coupling of a floating body with a gate electrode from a word line, which has been a disadvantage of a DRAM without a capacitor, is negligible. In other words, according to the present invention, a margin for the operating voltage as the dynamic flash memory can be widely designed.
Feature 3

In the dynamic flash memory according to the first embodiment of the present invention, a voltage is applied to both or one of the gate conductor layers 22a and 22b, and electrons are excited at the interface between the gate insulating layer 2b and the p-layer 4 and electrically connected to the n-layer 3, so that an effective contact area with the p-layer is increased, which in turn facilitates erasing of information in the memory.
Feature 4

A gate electrode of the MOSFET of the cell is structured so as to surround the p-layer 7, and an effective channel width increases, so that the number of surplus holes at the time of writing can be increased, and the cell current can be increased. This leads to a high-speed operation of the memory.

Second Embodiment

A method of manufacturing a dynamic flash memory according to the second embodiment will be described with reference to FIG. 4AA to FIG. 4JC. FIGS. 4AA, 4BA, 4CA, 4DA, 4EA, 4FA, 4GA, 4HA, 4IA, and 4JA are plan views. FIGS. 4AB, 4BB, 4CB, 4DB, 4EB, 4FB, 4GB, 4HB, 4IB, and 4JB are sectional views taken along line X-X' in FIGS. 4AA, 4BA, 4CA, 4DA, 4EA, 4FA, 4GA, 4HA, 4IA, and 4JA, respectively. FIGS. 4AC, 4BC, 4CC, 4DC, 4EC, 4FC, 4GC, 4HC, 4IC, and 4JC are sectional views taken along line Y-Y' in FIGS. 4AA, 4BA, 4CA, 4DA, 4EA, 4FA, 4GA, 4HA, 4IA, and 4JA, respectively.

As illustrated in FIGS. 4AA to 4AC, the p-layer 1, the n-layer 3, the p-layer 4, an insulating layer 41, and a mask material layer 42 are formed on the substrate 20 in this order. Note that the substrate 20 may be a semiconductor or an insulating film. The p-layer 1 and the n-layer 3 may each be a well layer. For example, a silicon oxide film may be used for the insulating layer 41, and a silicon nitride film or the like may be used for the mask material layer 42.

Figure 4B:
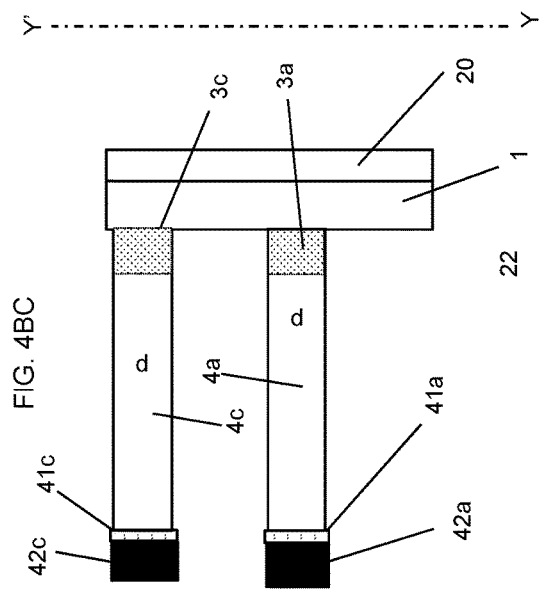
FIGS. 4BA, 4BB, and 4BC are diagrams illustrating the method of manufacturing the memory device according to the second embodiment.
Figure 4B:
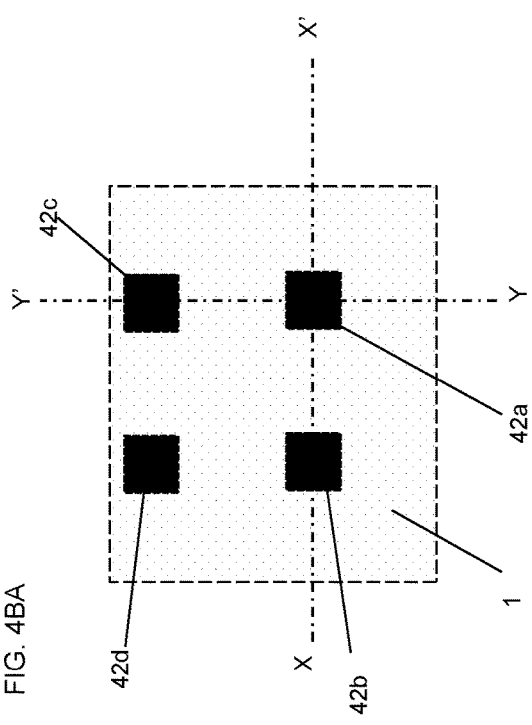
Figure 4B:
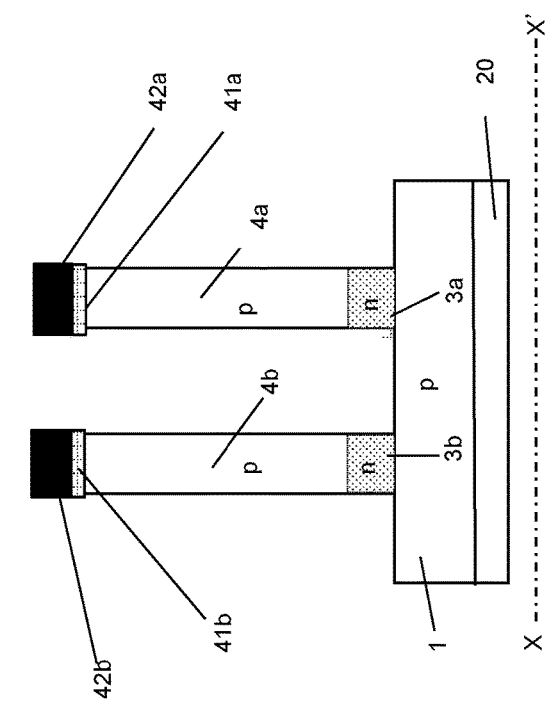

Next, as illustrated in FIGS. 4BA to 4BC, the insulating layer 41, the p-layer 4 and the n-layer 3 are etched by reactive ion etching (RIE) by using, as masks, mask material layers 42a to 42d that are formed by etching the mask material layer 42 illustrated in FIG. 4A such that portions of the mask material layer 42 are left behind and that are located in regions that will become memory cells. Note that, in FIGS. 4BA to 4BC, although the positions of bottom portions of grooves that are formed by the etching and the position of the bottom portion of the n-layer 3 are at the same level, it is only necessary that the bottom portions of the grooves be positioned deeper than an upper portion of the n-layer 3.

Then, as illustrated in FIGS. 4CA to 4CC, an insulating layer 2 is selectively formed by oxidation on the side walls and the bottom portions of the above-mentioned grooves. In FIG. 1 to FIG. 3C, although the insulating layer 2a and the gate insulating layer 2b are illustrated separately from each other, they will hereinafter be collectively referred to as the gate insulating layer 2. Although not illustrated, for example, an oxide film may be wholly formed by an atomic layer deposition (ALD) technique. In this case, the gate insulating layer 2 is also formed around the mask material layer 42.

Figure 4D:
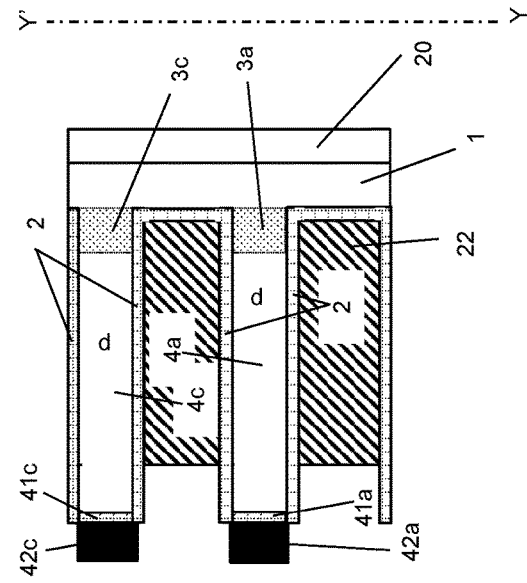
FIGS. 4DA, 4DB, and 4DC are diagrams illustrating the method of manufacturing the memory device according to the second embodiment.
Figure 4D:
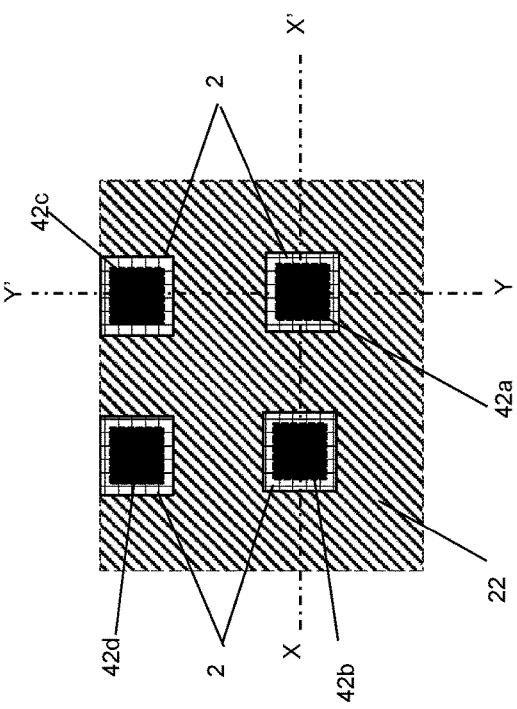
Figure 4D:
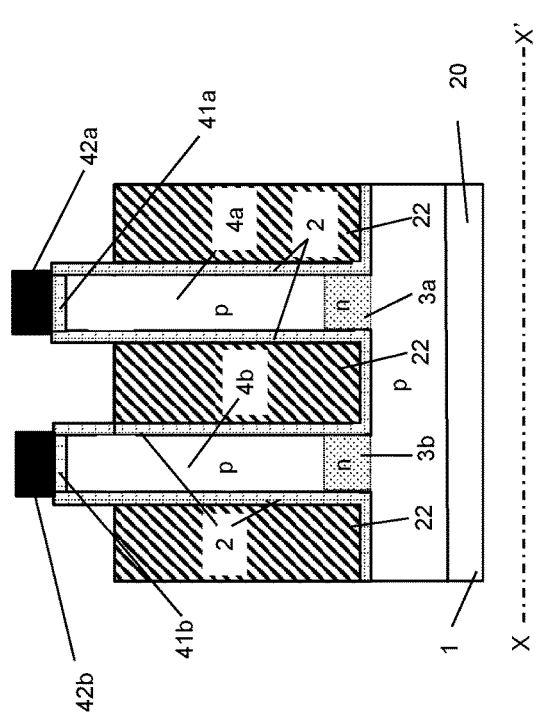

Subsequently, as illustrated in FIGS. 4DA to 4DC, after a gate conductor layer 22 has been deposited on the entire surface by, for example, a chemical vapor deposition (CVD) method, etch-back is performed by the selective RIE method, and then, etching is performed in such a manner that the upper surface of the gate conductor layer 22 is lower than the upper surface of the p-layer 4.

Figure 4E:
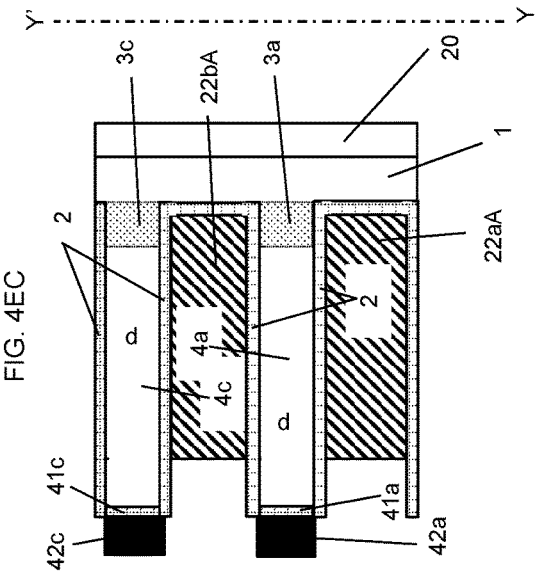
FIGS. 4EA, 4EB, and 4EC are diagrams illustrating the method of manufacturing the memory device according to the second embodiment.
Figure 4E:
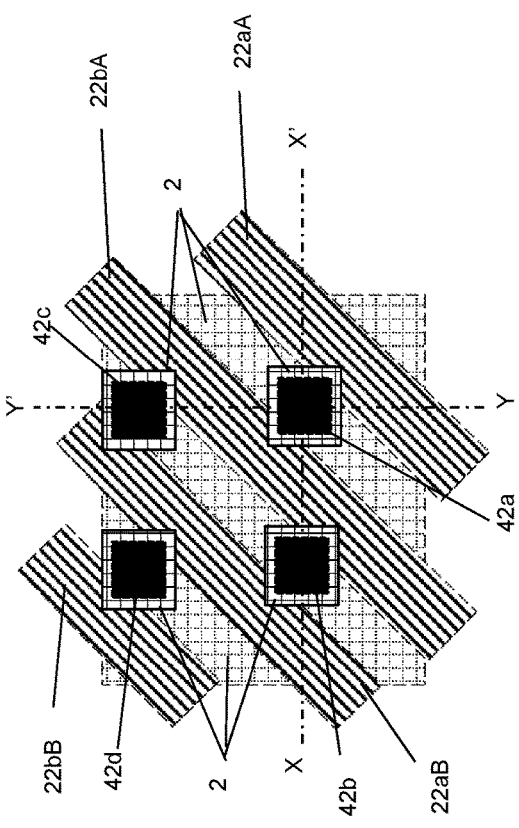
Figure 4E:
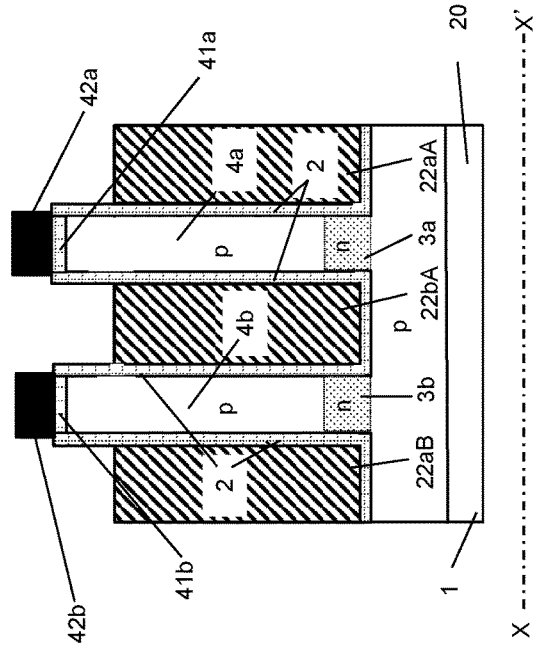

After that, as illustrated in FIGS. 4EA and 4EC, gate electrodes 22aA, 22aB, 22bA, and 22bB that are connected to the plate lines PL1 and PL2 are patterned. Note that, only in FIG. 4EA to 4EC, patterned gate electrodes are illustrated in such a manner as to extend also outside the region of four target cells for ease of understanding.

Figure 4F:
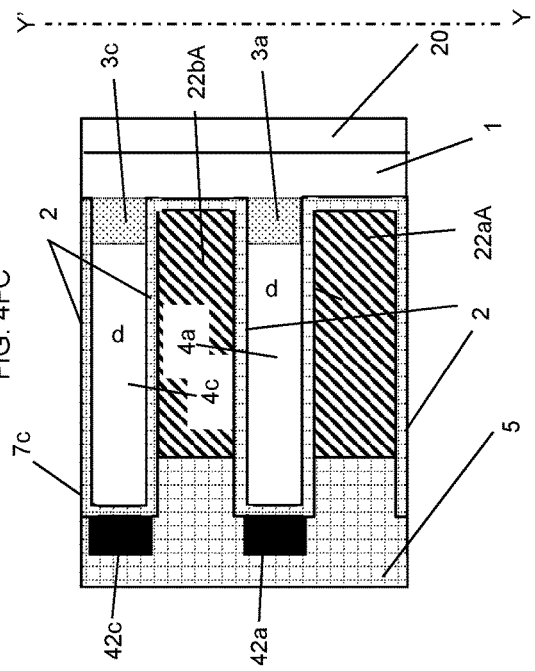
FIGS. 4FA, 4FB, and 4FC are diagrams illustrating the method of manufacturing the memory device according to the second embodiment.
Figure 4F:
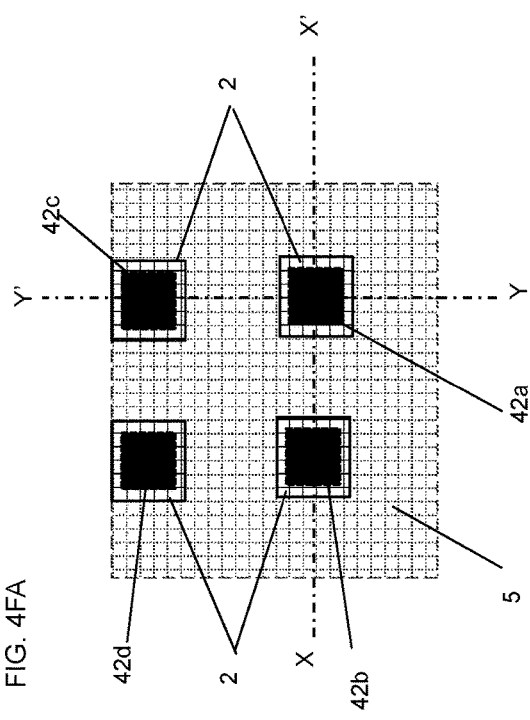
Figure 4F:
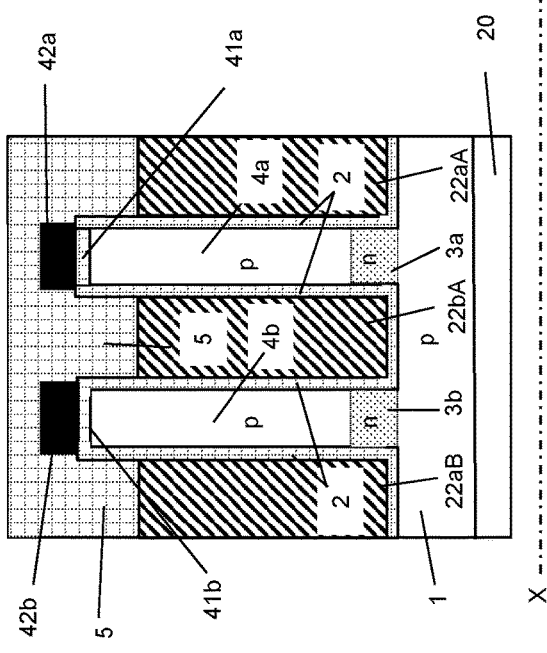

Next, as illustrated in FIGS. 4FA to 4FC, the insulating layer 5 is formed on the entire surface by, for example, the CVD method.

Figure 4G:
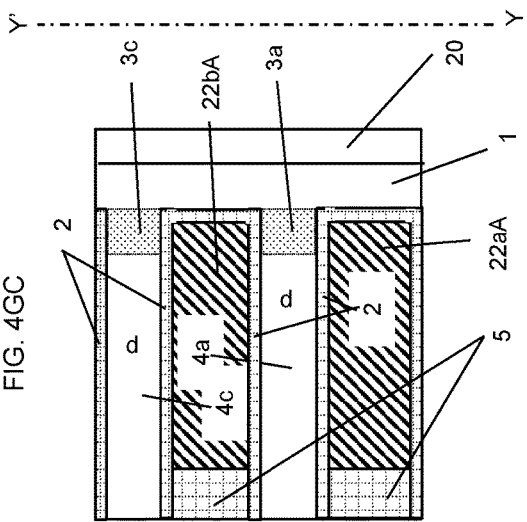
FIGS. 4GA, 4GB, and 4GC are diagrams illustrating the method of manufacturing the memory device according to the second embodiment.
Figure 4G:
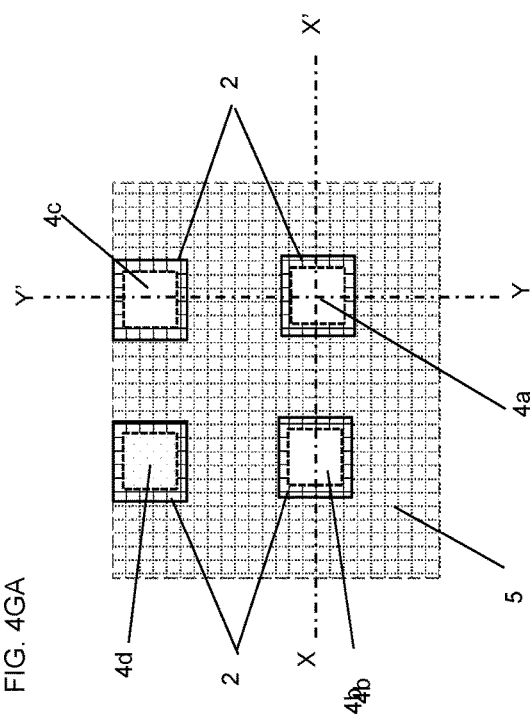
Figure 4G:
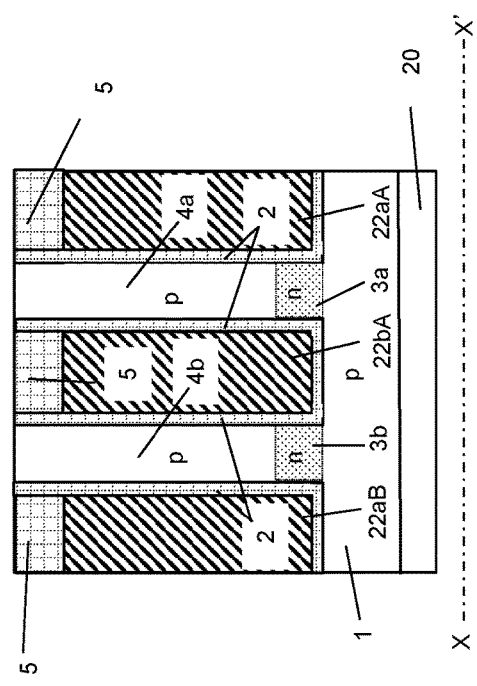

Then, as illustrated in FIGS. 4GA to 4GC, the insulating layer 5 is polished by a chemical mechanical polishing (CMP) technique until the surfaces of the mask material layers 42a to 42d are exposed, and the mask material layers 42a to 42d are selectively removed. In addition, the insulating layer 5 is etched back until the surface of the p-layer 4 is exposed, and the insulating layer 41 is etched at the same time.

Figure 4H:
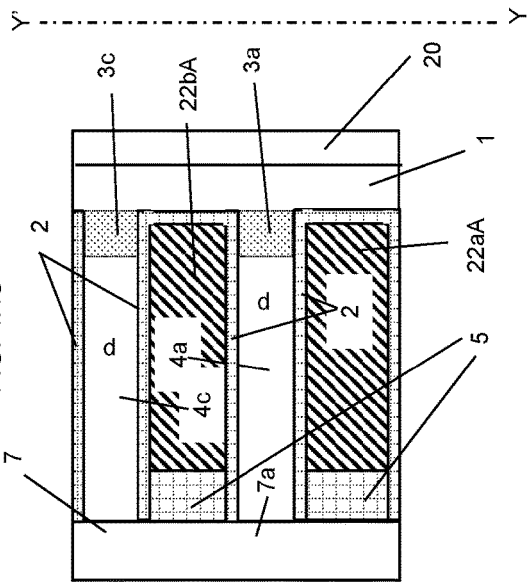
FIGS. 4HA, 4HB, and 4HC are diagrams illustrating the method of manufacturing the memory device according to the second embodiment.
Figure 4H:
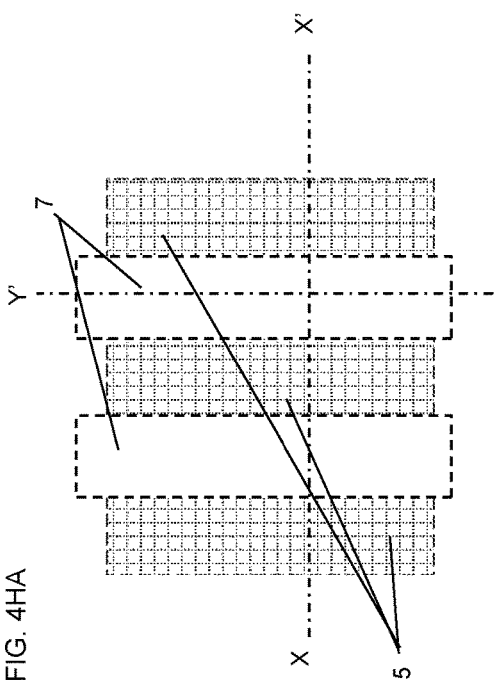
Figure 4H:
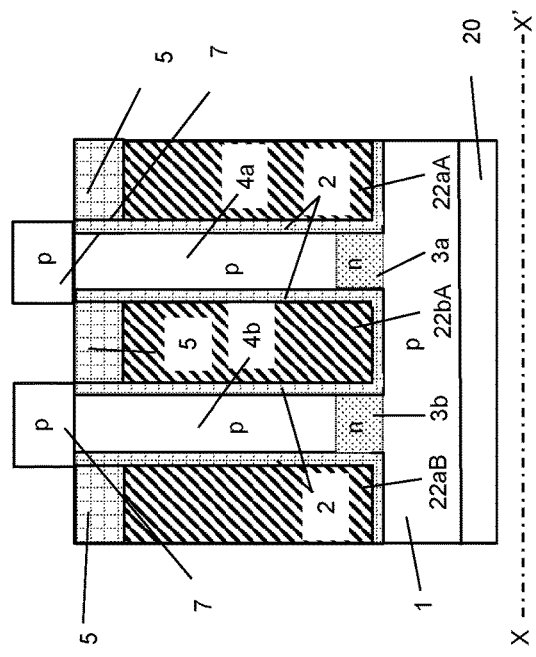

Subsequently, as illustrated in FIGS. 4HA to 4HC, the semiconductor layer 7 is grown by, for example, the CVD method so as to be contiguous as a crystalline layer to the p-layer 4 and then removed excluding portions that are necessary for operating as the MOSFETs in the memory cells.

Figure 4I:
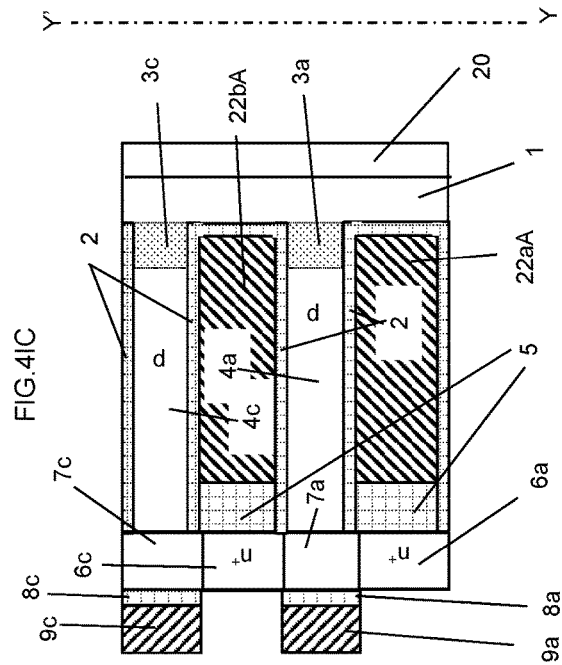
FIGS. 4IA, 4IB, and 4IC are diagrams illustrating the method of manufacturing the memory device according to the second embodiment.
Figure 4I:
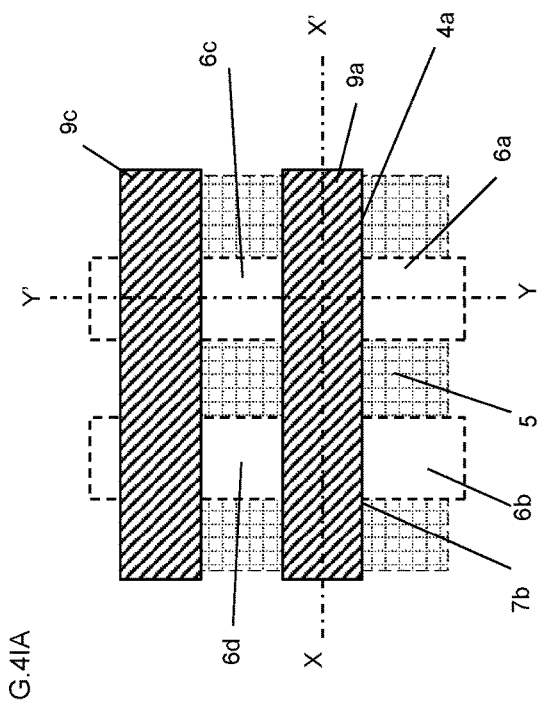
Figure 4I:
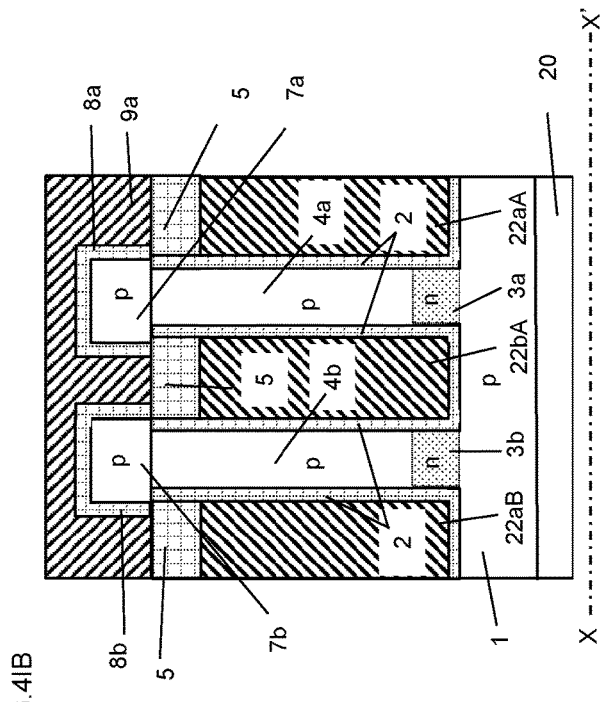

Next, as illustrated in FIGS. 4IA to 4IC, the gate insulating layer 8 is formed, and the gate conductor layer 9 is formed. Then, the gate insulating layer 8 and the gate conductor layer 9 are processed so as to become the gate electrodes of the MOSFETs in the memory cells. In FIGS. 4IA to 4IC, the gate insulating layer 8 is illustrated as gate insulating layers 8a, 8b, and 8c, and the gate conductor layer 9 is illustrated as gate conductor layers 9a and 9c. After that, the $n^+$-layer 6a and the $n^+$-layer 6b are formed in a self-aligned manner.

Then, as illustrated in FIGS. 4JA to 4JC, after an insulating layer 31 has been formed on the entire surface, contact holes 33a to 33d are formed in the memory cells. Subsequently, wiring conductor layers 35 and 36 are formed. The wiring conductor layer 35 is connected to the source line SL. After that, an insulating film 38 is formed. Then, second contact holes 37c and 37d are formed, and a wiring conductor layer 39 is formed. The wiring conductor layer 39 is connected to the bit line BL.

Note that, in the plan view of FIG. 4JA, although only the second wiring conductor layer 39 and the insulating film 38 are present at an upper portion in practice, p-layers 4a to 4d that are included in the p-layer 4 and that are principal lower layer portions, the gate conductor layers 9a and 9c, which are principal lower layer portions, contact holes 33a and 33b, and the contact holes 33c, 33d, 37c, and 37d are illustrated for ease of understanding.

In FIG. 4AA to FIG. 4JC, although the shapes of the grooves have been described by using vertical cross sections of rectangular shapes, the shapes may be trapezoidal shapes.

In the present invention, although FIG. 4BA to FIG. 4DC illustrate a method in which the gate insulating layer 2 and the gate conductor layer 22 are formed after the n-layer 3 and the p-layer 4 have been formed, a method may be employed in which a hole is vertically formed such that the p-layer 1 is exposed after the gate insulating layer 2 and the gate conductor layer 22 have been formed and in which the n-layer 3 and the p-layer 4 are formed by a selective epitaxial technique.

In the present embodiment, although the impurity layer 3 and the impurity layer 4 each have a columnar shape with a quadrangular bottom surface, the impurity layer 3 and the impurity layer 4 may each have a columnar shape with a circular bottom surface.

Since it is only necessary that the n-layer 3 be present at a portion where there will be a memory cell in the future, although the n-layer 3 is formed on the entire surface of the p-layer 1 in FIGS. 4AA to 4AC, the n-layer 3 may be formed only in a selected region of the upper surface of the p-layer 1.

The materials of the mask material layer 42 and the gate insulating layer 2 may be any materials as long as etch selectivity can be ensured.

The gate conductor layer 22 may be either a semiconductor or a conductor as long as a voltage can be applied thereto.

Although FIGS. 4FA to 4FC illustrate the case where the mask materials 42a to 42d are used as endpoint materials of the CMP, the gate insulating layer 2, the p-layer 4, or the like may also be used.

Any insulating films that are used in a normal MOS process can be used for the gate insulating layer 2 and the gate insulating layer 8, and examples of such insulating films include a $SiO_2$ film, a SiON film, a HfSiON film, and a $SiO_2$/SiN laminated film.

Although the method in which the wiring conductor layer 36 and the wiring conductor layer 39 are separately formed so as to be connected to the bit line BL has been described above, the wiring conductor layers 36 and 39 and the contact holes 33c and 37c can be formed through a single damascene process or the like.

In the present invention, although FIG. 4AA to FIG. 4JC illustrate the case where the gate conductor layer 9, the semiconductor layer 7, and all the wiring conductor layers extend parallel to or perpendicular to the X-X' axis or the Y-Y' axis, each of them may extends in an oblique direction.

The present embodiment has the following features.

Feature 1

According to the method of manufacturing the dynamic flash memory of the second embodiment of the present invention, a wafer that is used in a normal MOS process can be used, and thus, no additional material costs are required. In addition, a semiconductor device other than a memory section is compatible with a normal generalized MOS process and is easy to introduce.

Feature 2

The n+-layer 6a, the wiring conductor layer 35 connected to the source line SL, and the contact hole 33a of the dynamic flash memory cell illustrated in FIGS. 4JA to 4JC are shared with the adjacent cell. In addition, an n+-layer 6c, the wiring conductor layers 36 and 39 connected to the bit line BL, the contact holes 33c and 37c are shared with the adjacent cell. Thus, the cell area of the dynamic flash memory according to the present invention is determined by the lines and spaces of p-layers 7a and 7b and the lines and spaces of the gate conductor layers 9a and 9c or the lines and spaces of the wiring conductor layers 35 and 36. Therefore, when the minimum dimension in manufacturing is F, the cell area is $4F^2$, and a fine memory cell can be provided.

Third Embodiment

Figures 5A, 5B:
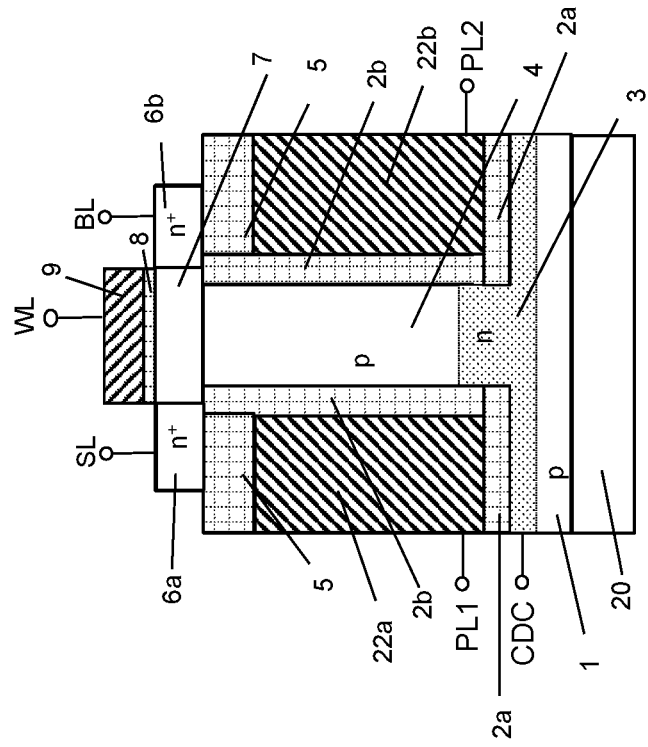
FIGS. 5A and 5B are diagrams illustrating a sectional structure of a memory device using a semiconductor device according to a third embodiment.

A dynamic flash memory of the third embodiment of the present invention will be described with reference to FIG. 5A and FIG. 5B. In FIG. 5A and FIG. 5B, components that are the same as or similar to the components illustrated in FIG. 1 are denoted by the same reference signs.

As illustrated in FIG. 5A, the bottom of the n-layer 3 in FIG. 1 is positioned deeper than the gate insulating layer 2, and the n-layer 3 is shared by a plurality of cells. The configuration illustrated in FIG. 5A is the same as that illustrated in FIG. 1, except with regard to the position of the bottom of the n-layer 3. In this case, the gate insulating layer 2 does not need to be in contact with the p-layer 1. Even with such a configuration, the dynamic flash memory can operate by applying voltages to the source line SL, the plate line PL1, the plate line PL2, the word line WL, the bit line BL as in the first embodiment.

In the case where the n-layer 3 is shared by a plurality of cells as illustrated in FIG. 5B, multiple memory operations can also be controlled simultaneously by connecting the n-layer 3 to a control line CDC, which is a sixth wiring conductor layer (and which is an example of a "control line" in the claims), and applying a voltage to the n-layer 3.

When writing logical stored data "1", in addition to the voltage application conditions in the first embodiment, for example, 1 V is applied to the control line CDC so as to prevent a PN junction formed with the p-layer 4 from being biased in the forward direction and to suppress recombination of electrons and holes, and accumulation of holes can be facilitated.

When erasing stored data to "0", for example, even if −3 V is applied to the control line CDC and the p-layer 1, and the other potentials are set to 0 V, a pn junction formed between the p-layer 4 and the n-layer 3 is biased in the forward direction, and thus, the holes accumulated in the memory cell can be promptly discharged. In addition, as another example, when 2 V is applied to the plate line PL1, −1 V is applied to the control line CDC and the p-layer 1, and 0 V is applied to the other terminals, an inversion layer is formed at the interface of the gate insulating layer 2b as illustrated in FIGS. 3A, 3B, and 3C, the recombination area of electrons and holes is increased, and a reduction in the time taken for an erase operation can also be achieved. As described above, according to the third embodiment, the margins for writing "1" and an erase operation to "0" of logical stored data in the first embodiment can be further increased.

The present embodiment has the following features.

Feature 1

As in the first embodiment, the dynamic flash memory can operate by applying voltages to the source line SL, the plate line PL1, the plate line PL2, the word line WL, and the bit line BL. In addition, by applying a voltage to the control line CDC, the operation margins for writing "1" and erasing "0" of stored information data can be increased, and a high-speed memory operation can be performed.

Feature 2

Since there are a plurality of cells in the n-layer 3, "0" erase can be performed for the plurality of cells at once.

Various embodiments and modifications may be made according to the present invention within the broad spirit and scope of the present invention. In addition, the above embodiments are described for explaining an example of the present invention and do not limit the scope of the present invention. The above-described embodiments and modifications can be appropriately combined. In addition, another embodiment that is obtained by removing some of the components of the above-described embodiments as necessary is also within the technical concept of the present invention.

By using the memory function using a semiconductor device according to the present invention, a higher-speed dynamic flash memory with longer storage time and lower power consumption compared to the related art can be provided.

What is claimed is:
1. A memory device using a semiconductor device comprising:
   a substrate;
   a first semiconductor layer that is disposed on the substrate;
   a first impurity layer that is disposed on a portion of a surface of the first semiconductor layer and at least a portion of which has a columnar shape;
   a second impurity layer that is in contact with the portion of the first impurity layer having a columnar shape and that extends in a vertical direction;
   a first insulating layer that covers a portion of the first semiconductor layer and a portion of the first impurity layer;
   a first gate insulating layer that is in contact with the first insulating layer and that surrounds the first impurity layer and the second impurity layer;
   a first gate conductor layer and a second gate conductor layer that are in contact with the first insulating layer and the first gate insulating layer;
   a second insulating layer that is formed in such a manner as to be in contact with the first gate conductor layer, the second gate conductor layer, the first insulating layer, and the first gate insulating layer;
   a second semiconductor layer that is in contact with the second impurity layer;
   a second gate insulating layer that partially or entirely surrounds an upper portion of the second semiconductor layer;
   a third gate conductor layer that partially or entirely covers an upper portion of the second gate insulating layer;
   a third impurity layer and a fourth impurity layer each of which is in contact with one of two side surfaces of the second semiconductor layer located outside an end of the third gate conductor layer in a horizontal direction in which the second semiconductor layer extends;
   a first wiring conductor layer that is connected to the third impurity layer;

a second wiring conductor layer that is connected to the fourth impurity layer;
a third wiring conductor layer that is connected to the third gate conductor layer;
a fourth wiring conductor layer that is connected to the first gate conductor layer; and
a fifth wiring conductor layer that is connected to the second gate conductor layer,
wherein a memory write operation is performed by performing an operation of generating a group of electrons and a group of holes in the second semiconductor layer and the second impurity layer by using impact ionization that is caused by a current supplied between the third impurity layer and the fourth impurity layer or by using a gate-induced drain leakage current, an operation of discharging minority carriers in the second semiconductor layer and the second impurity layer, the minority carriers being the generated group of electrons or the generated group of holes, and an operation of causing a subset or all of majority carriers in the second semiconductor layer and the second impurity layer, the majority carriers being the group of electrons or the group of holes, to remain in the second semiconductor layer and the second impurity layer by controlling voltages that are applied to the first wiring conductor layer, the second wiring conductor layer, the third wiring conductor layer, the fourth wiring conductor layer, and the fifth wiring conductor layer, and
wherein a memory erase operation is performed by extracting the majority carriers remaining in the second semiconductor layer, the majority carriers being the group of electrons or the group of holes, from at least one location of the first impurity layer, the third impurity layer, and the fourth impurity layer by controlling voltages that are applied to the first wiring conductor layer, the second wiring conductor layer, the third wiring conductor layer, the fourth wiring conductor layer, and the fifth wiring conductor layer.

2. The memory device using a semiconductor device according to claim 1, wherein
the first wiring conductor layer that is connected to the third impurity layer is a source line,
the second wiring conductor layer that is connected to the fourth impurity layer is a bit line,
the third wiring conductor layer that is connected to the third gate conductor layer is a word line,
the fourth wiring conductor layer that is connected to the first gate conductor layer is a first plate line,
the fifth wiring conductor layer that is connected to the second gate conductor layer is a second plate line, and
write and erase memory operations are performed by applying voltages to the source line, the bit line, the first plate line, the second plate line, and the word line.

3. The memory device using a semiconductor device according to claim 2,
wherein a concentration of carriers at an interface between the first gate insulating layer and the second impurity layer is changed by synchronizing the voltages applied to the first plate line and the second plate line.

4. The memory device using a semiconductor device according to claim 2,
wherein a concentration of carriers at an interface between the first gate insulating layer and the second impurity layer is changed by applying independent voltages to the first plate line and the second plate line.

5. The memory device using a semiconductor device according to claim 2,
wherein, by applying voltages to the first plate line and the second plate line, majority carriers the same as majority carriers in the first impurity layer are excited, and an electrical contact area between the first impurity layer and the second impurity layer is changed.

6. The memory device using a semiconductor device according to claim 2,
wherein a source-line contact hole for connecting the source line to the third impurity layer and the first wiring conductor layer are shared by adjacent cells.

7. The memory device using a semiconductor device according to claim 2,
wherein a bit-line contact hole for connecting the bit line to the fourth impurity layer and the second wiring conductor layer are shared by adjacent cells.

8. The memory device using a semiconductor device according to claim 2,
wherein a bottom portion of the first impurity layer is located at a position deeper than a bottom portion of the first insulating layer, and
wherein the first impurity layer is shared by a plurality of cells.

9. The memory device using a semiconductor device according to claim 1,
wherein majority carriers in the first impurity layer are different from majority carriers in the first semiconductor layer.

10. The memory device using a semiconductor device according to claim 1,
wherein the majority carriers in the second impurity layer are the same as majority carriers in the first semiconductor layer.

11. The memory device using a semiconductor device according to claim 1,
wherein majority carriers in the third impurity layer and majority carriers in the fourth impurity layer are the same as majority carriers in the first impurity layer.

12. The memory device using a semiconductor device according to claim 1,
wherein an impurity concentration of the first impurity layer is lower than an impurity concentration of the third impurity layer and lower than an impurity concentration of the fourth impurity layer.

13. The memory device using a semiconductor device according to claim 1,
wherein contact surfaces of the first impurity layer and the second impurity layer are located at positions shallower than a bottom portion of the first gate conductor layer and shallower than a bottom portion of the second gate conductor layer.

14. The memory device using a semiconductor device according to claim 1,
wherein the first semiconductor layer, the first impurity layer, the second impurity layer, the second semiconductor layer, and the third impurity layer form a thyristor structure.

15. The memory device using a semiconductor device according to claim 14, further comprising:
a sixth wiring conductor layer that is connected to the first impurity layer,
wherein the sixth wiring conductor layer is a control line and is capable of applying a desired voltage.

16. The memory device using a semiconductor device according to claim 1, wherein a bottom portion of the first impurity layer is located at a position deeper than a bottom portion of the first insulating layer, and wherein the first impurity layer is shared by a plurality of cells.

17. The memory device using a semiconductor device according to claim 1, wherein the first semiconductor layer, the first impurity layer, the second impurity layer, the second semiconductor layer, and the fourth impurity layer form a thyristor structure.

18. The memory device using a semiconductor device according to claim 1, wherein the first impurity layer is connected between adjacent cells by a semiconductor or a metal layer.

* * * * *